(12) United States Patent
Yonekawa et al.

(10) Patent No.: US 10,770,284 B2
(45) Date of Patent: Sep. 8, 2020

(54) SUBSTRATE PROCESSING METHOD AND SUBSTRATE PROCESSING APPARATUS

(71) Applicant: TOKYO ELECTRON LIMITED, Minato-ku, Tokyo (JP)

(72) Inventors: Hiroki Yonekawa, Kumamoto (JP); Shuhei Takahashi, Kumamoto (JP); Kouzou Tachibana, Kumamoto (JP); Hideki Nishimura, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/854,075

(22) Filed: Dec. 26, 2017

(65) Prior Publication Data
US 2018/0182616 A1   Jun. 28, 2018

(30) Foreign Application Priority Data
Dec. 27, 2016  (JP) .................... 2016-252428

(51) Int. Cl.
| | |
|---|---|
| *H01L 21/02* | (2006.01) |
| *H01L 21/306* | (2006.01) |
| *H01L 21/67* | (2006.01) |
| *H01L 21/3213* | (2006.01) |

(52) U.S. Cl.
CPC .. *H01L 21/02057* (2013.01); *H01L 21/30604* (2013.01); *H01L 21/32134* (2013.01); *H01L 21/6704* (2013.01); *H01L 21/6708* (2013.01); *H01L 21/67023* (2013.01); *H01L 21/67051* (2013.01); *H01L 21/67075* (2013.01)

(58) Field of Classification Search
None
See application file for complete search history.

(56) References Cited

U.S. PATENT DOCUMENTS

| | | | |
|---|---|---|---|
| 6,239,762 B1* | 5/2001 | Lier ....................... | H01Q 13/10 343/700 MS |
| 7,160,808 B2* | 1/2007 | Kassir ............... | H01L 21/30608 257/E21.223 |
| 2003/0020928 A1* | 1/2003 | Ritzdorf ............ | H01L 21/67103 356/630 |
| 2004/0074870 A1* | 4/2004 | Koike ....................... | C23F 1/02 216/83 |
| 2008/0236872 A1* | 10/2008 | Kataoka .................... | H05K 3/06 174/254 |

(Continued)

FOREIGN PATENT DOCUMENTS

JP   2010-177652   8/2010

*Primary Examiner* — Shamim Ahmed
(74) *Attorney, Agent, or Firm* — Amin, Turocy & Watson, LLP

(57) ABSTRACT

A substrate processing method according to an embodiment includes an etching process, a temperature-difference forming process, and a rinsing process. The etching process supplies an etchant onto a first surface of a substrate on which a pattern is formed to etch the pattern. The temperature-difference forming process makes, in parallel with the etching process, a temperature in a lower portion of the pattern lower than a temperature in an upper portion of the pattern. The rinsing process supplies rinse liquid onto the first surface after the etching process to replace the etchant remaining on the pattern with the rinse liquid.

10 Claims, 11 Drawing Sheets

(56) References Cited

U.S. PATENT DOCUMENTS

| | | | |
|---|---|---|---|
| 2011/0059619 A1* | 3/2011 | Yaguchi | H01L 21/30608 438/753 |
| 2014/0127908 A1* | 5/2014 | Okutani | H01L 21/02068 438/694 |
| 2019/0027383 A1* | 1/2019 | Nakai | H01L 21/304 |

* cited by examiner

Prior Art

SUBSTRATE PROCESSING METHOD AND SUBSTRATE PROCESSING APPARATUS

CROSS-REFERENCE TO RELATED APPLICATIONS

The present application claims priority to and incorporates by reference the entire contents of Japanese Patent Application No. 2016-252428 filed in Japan on Dec. 27, 2016.

FIELD

An exemplary embodiment disclosed herein relates to a substrate processing method and a substrate processing apparatus.

BACKGROUND

Conventionally, there has been known an etching process for processing patterns on a substrate by supplying an etchant onto the substrate such as a semiconductor wafer (see Japanese Laid-open Patent Publication No. 2010-177652). After the etching process, a rinsing process for replacing the etchant remaining on the substrate with rinse liquid is performed by supplying the rinse liquid onto the substrate.

However, it is hard to replace the etchant penetrating deeply into gaps between the patterns with the rinse liquid, and thus it needs time to complete the replacement in the gaps compared with the upper portions of the patterns. For this reason, there is a possibility that the lower portions of the patterns are excessively etched compared with the upper portions of the patterns. In other words, there is a possibility that an amount of etching of the patterns becomes uneven in a vertical direction.

SUMMARY

It is an object of the present invention to at least partially solve the problems in the conventional technology.

A substrate processing method according to an aspect of an embodiment includes an etching process, a temperature-difference forming process, and a rinsing process. The etching process supplies an etchant onto a first surface of a substrate on which a pattern is formed to etch the pattern. The temperature-difference forming process makes, in parallel with the etching process, a temperature in a lower portion of the pattern lower than a temperature in an upper portion of the pattern. The rinsing process supplies rinse liquid onto the first surface after the etching process to replace the etchant remaining on the pattern with the rinse liquid.

BRIEF DESCRIPTION OF DRAWINGS

A more complete appreciation of the present application and many of the attendant advantages thereof will be readily obtained as the same becomes better understood by reference to the following detailed description when considered in connection with the accompanying drawings, wherein.

DESCRIPTION OF EMBODIMENT

An exemplary embodiment of a substrate processing method and a substrate processing apparatus disclosed in the present application will be described below in detail with reference to the accompanying drawings. In addition, the illustrative embodiment disclosed below is not intended to limit the present invention.

Figure 1A:
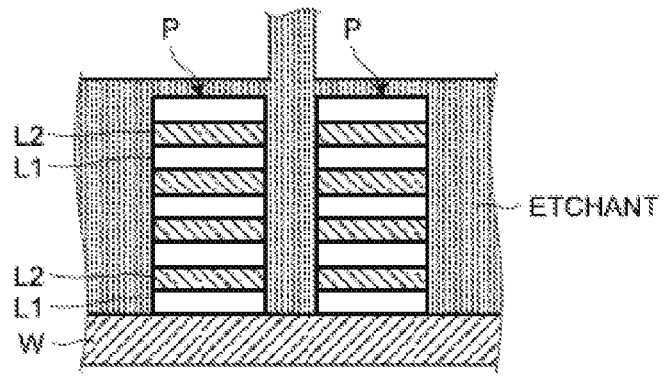
FIG. 1A is a diagram explaining a conventional substrate processing method.
Figure 1A:
Figure 1A:
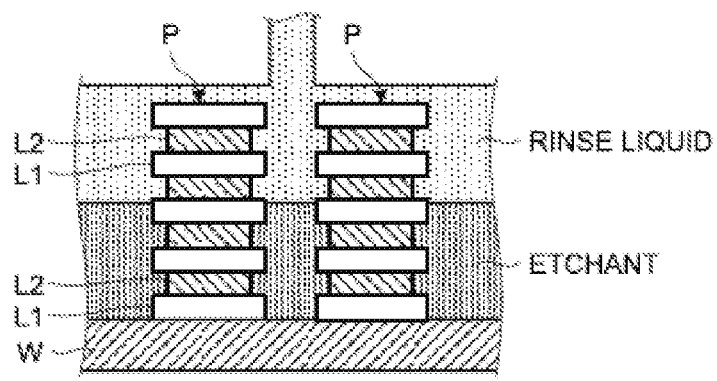
Figure 1A:
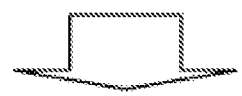
Figure 1A:
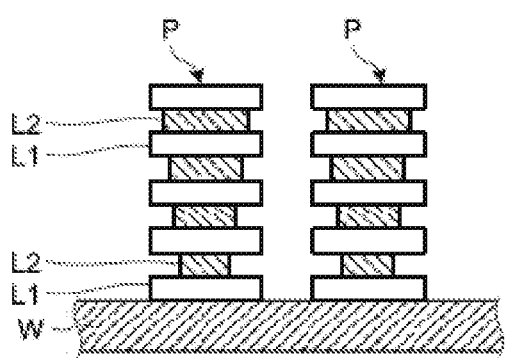
Figure 1B:
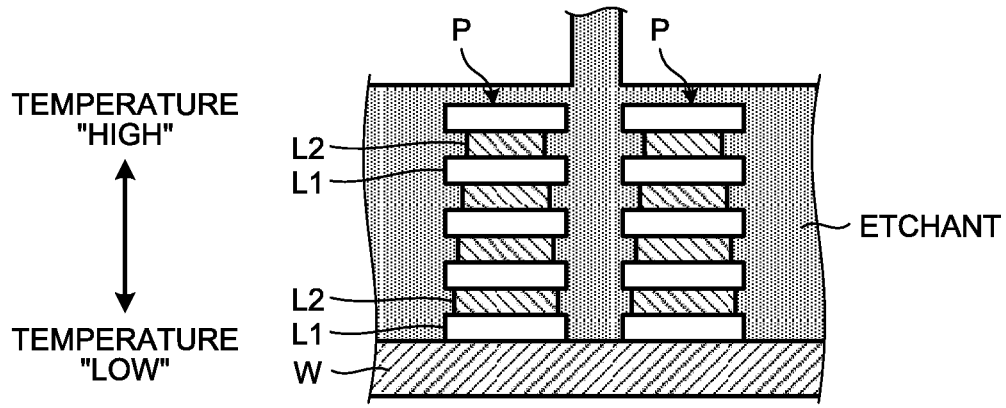
FIG. 1B is a diagram explaining a substrate processing method according to an embodiment.
Figure 1B:
Figure 1B:
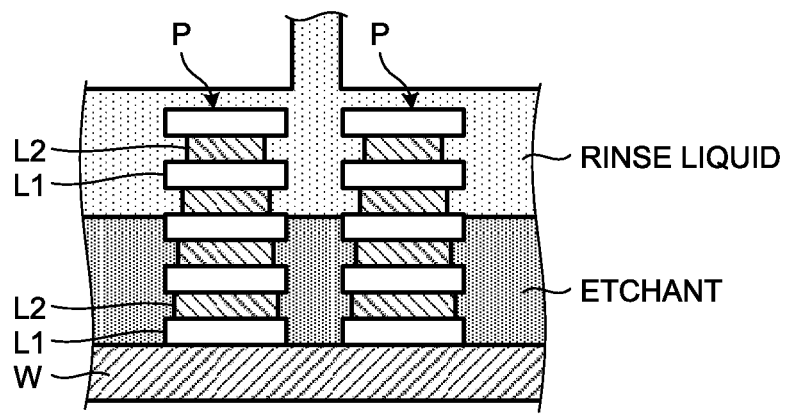
Figure 1B:
Figure 1B:
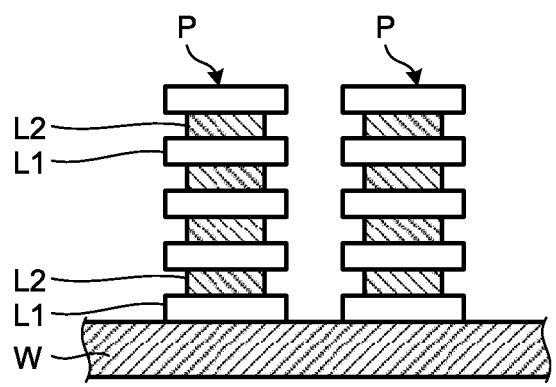

First, a substrate processing method according to an embodiment will be described with reference to FIGS. 1A and 1B. FIG. 1A is a diagram explaining a conventional substrate processing method. FIG. 1B is a diagram explaining a substrate processing method according to the present embodiment.

In the present specification, a "pattern" means a circuit that is convexly formed on the surface of a substrate W (hereinafter, referred to as "wafer W") such as a semiconductor wafer. Furthermore, in the present specification, among both ends of the pattern in a protruding direction, an end close to the surface of the wafer W is referred to as a "lower portion of the pattern", and the other end far away from the surface of the wafer W is referred to as an "upper portion of the pattern". In other words, even if a pattern-formed surface of the wafer W faces downward, an end close to the pattern-formed surface is referred to as a "lower portion of the pattern" and the other end far away from the pattern-formed surface is referred to as an "upper portion of the pattern".

As illustrated in FIG. 1A, an etching process for etching patterns P is performed by supplying an etchant onto the pattern-formed surface (herein, upper surface) of the wafer W (see the upper drawing of FIG. 1A). As an example, FIG. 1A illustrates that, within the patterns P in which first films L1 (e.g., insulating film) and second films L2 (e.g., polysilicon film) are alternately laminated, only the second films L2 are etched. However, it is sufficient that the patterns P are formed on the pattern-formed surface of the wafer W at least convexly. Therefore, the patterns P are not necessarily formed by laminating a plurality of films. Furthermore, the etching process is not limited to etching only a part of the patterns P, but may etch the patterns P as a whole.

Next, a rinsing process for replacing the etchant remaining on the upper surface of the wafer W with rinse liquid is performed by supplying the rinse liquid onto the upper surface of the wafer W. In the rinsing process, the etching of the patterns P is terminated by totally replacing the etchant remaining on the wafer W with the rinse liquid.

However, compared with the replacement of the etchant remaining on the upper portions of the patterns P with the rinse liquid, the replacement of the etchant penetrating deeply into gaps between the patterns P with the rinse liquid takes time. For this reason, even after the etchant on the upper portions of the patterns P is replaced with the rinse liquid, the etchant remains on the lower portions of the patterns P for a while (see the middle drawing of FIG. 1A). As a result, the lower portions of the patterns P are excessively etched compared with the upper portions of the patterns P, and thus the vertical-direction uniformity of amounts of etching of the patterns P is decreased. Specifically, as illustrated in the lower drawing of FIG. 1A, the etching-processed patterns P have the widths of the second films L2 that are gradually decreased from the upper portions toward the lower portions of the patterns P.

On the other hand, the reactivity of an etchant increases as the temperature of the etchant becomes higher. Therefore, as illustrated in FIG. 1B, in the substrate processing method according to the present embodiment, a temperature-difference forming process for making a temperature in the lower portions of the patterns P lower than a temperature in the upper portions of the patterns P is performed in parallel with the etching process (see the upper drawing of FIG. 1B).

The temperature in the lower portions of the patterns P is made lower than the temperature of the upper portions of the patterns P, and thus reactivity of the etchant in the lower portions of the patterns P becomes lower than reactivity of the etchant in the upper portions of the patterns P. As a result, an amount of etching of the lower portions of the patterns P in the etching process can become lower than an amount of etching in the upper portions of the patterns P.

After that, in the rinsing process, the etchant remaining on the upper surface of the wafer W is replaced with the rinse liquid by supplying the rinse liquid onto the upper surface of the wafer W. As described above, in the rinsing process, the etchant remains on the lower portions of the patterns P for a while even after the etchant on the upper portions of the patterns P is replaced with the rinse liquid. During that time, because only the lower portions of the patterns P are etched (see the middle drawing of FIG. 1B), an amount of etching in the lower portions of the patterns P can approximate an amount of etching in the upper portions of the patterns P (see the lower drawing of FIG. 1B).

As described above, the substrate processing method according to the present embodiment foresees that the lower portions of the patterns P are excessively etched in the rinsing process, and sets an amount of etching of the lower portions of the patterns P in the etching process to be lower than an amount of etching of the upper portions of the patterns P. As a result, it is possible to enhance the uniformity of amounts of etching of the patterns P in a vertical direction.

Figure 2:
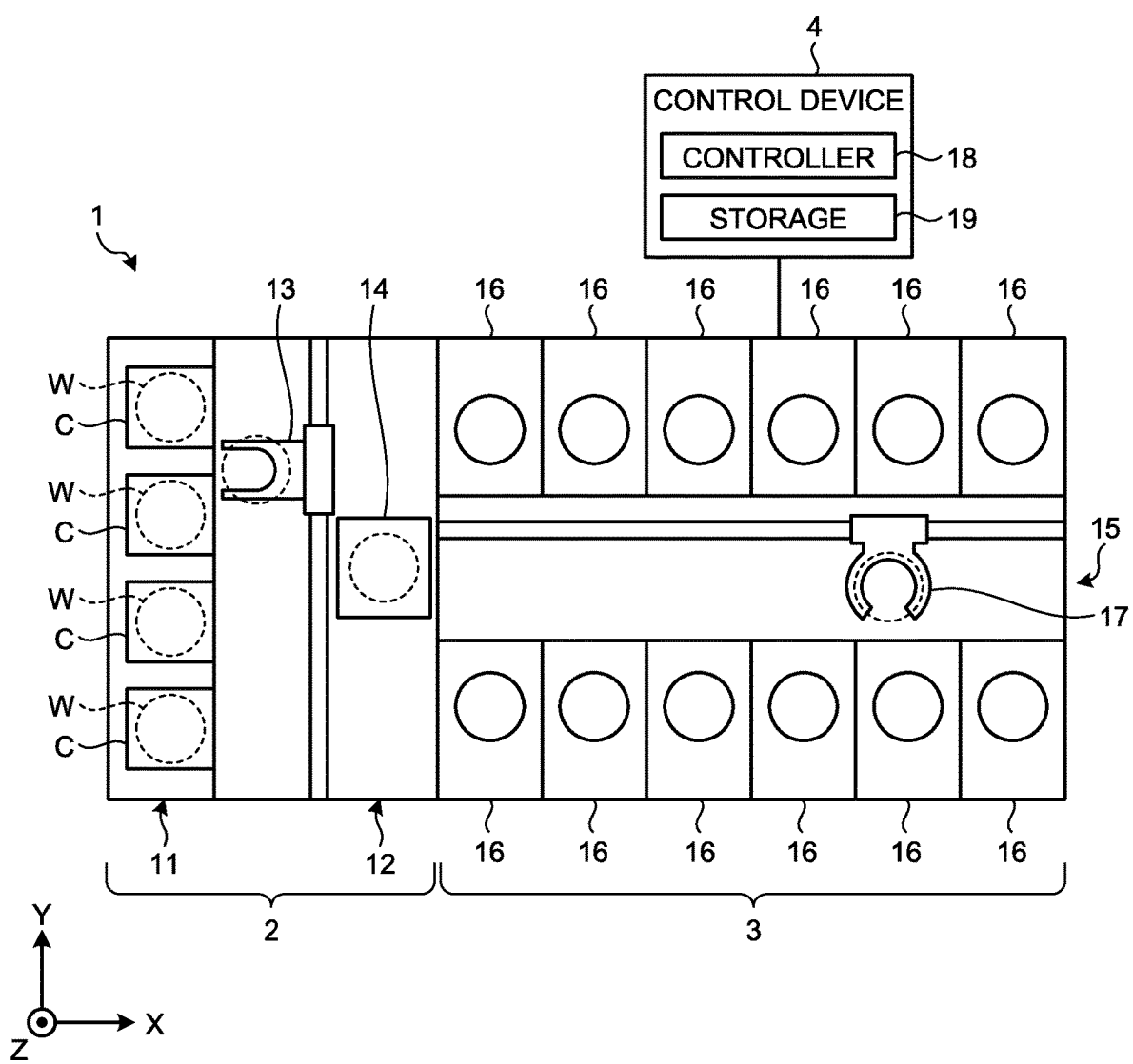
FIG. 2 is a diagram illustrating a schematic configuration of a substrate processing system according to the present embodiment.

Hereinafter, a substrate processing system that performs the substrate processing method described above will be described. First, the configuration of a substrate processing system according to the present embodiment will be described with reference to FIG. 2. FIG. 2 is a diagram illustrating a schematic configuration of a substrate processing system according to the present embodiment.

FIG. 2 is a diagram illustrating a schematic configuration of a substrate processing system 1 according to the present embodiment. Hereinafter, in order to make a positional relationship clear, X-axis, Y-axis, and Z-axis will be defined to be perpendicular to each other and the positive Z-axis direction is regarded as a vertically upward direction.

As illustrated in FIG. 2, the substrate processing system 1 includes a carry-in/out station 2 and a processing station 3. The carry-in/out station 2 and the processing station 3 are provided adjacent to each other.

The carry-in/out station 2 includes a carrier placing section 11 and a transfer section 12. In the carrier placing section 11, a plurality of carriers C are placed to horizontally accommodate a plurality of substrates, namely, semiconductor wafers (hereinafter, wafer W) in the present embodiment.

The transfer section 12 is provided adjacent to the carrier placing section 11, and includes therein a substrate transfer device 13 and a delivery unit 14. The substrate transfer device 13 includes a wafer holding mechanism configured to hold the wafer W. The substrate transfer device 13 is movable horizontally and vertically and is pivotable around a vertical axis, and transfers the wafer W between the corresponding carrier C and the delivery unit 14 by using the wafer holding mechanism.

The processing station 3 is provided adjacent to the transfer section 12. The processing station 3 includes a transfer section 15 and a plurality of processing units 16. The plurality of processing units 16 are provided side by side at both sides of the transfer section 15.

The transfer section 15 includes therein a substrate transfer device 17. The substrate transfer device 17 includes a wafer holding mechanism configured to hold the wafer W. The substrate transfer device 17 is movable horizontally and vertically and is pivotable around a vertical axis, and transfers the wafer W between the delivery unit 14 and the corresponding processing unit 16 by using the wafer holding mechanism.

Each of the processing units 16 performs a predetermined substrate processing on the wafer W transferred by the substrate transfer device 17.

The substrate processing system 1 further includes a control device 4. The control device 4 is a computer, for example. The control device 4 includes a controller 18 and a storage 19. The storage 19 stores therein a program for controlling various types of processes that are performed in the substrate processing system 1. The controller 18 reads out and executes the program stored in the storage 19 to control operations of the substrate processing system 1.

The program may be recorded in a computer-readable recording medium and thus may be installed into the storage 19 of the control device 4 from the recording medium. A computer-readable recording medium includes, for example, a hard disk (HD), a flexible disk (FD), a compact disc (CD), a magneto-optical disk (MO), and a memory card.

In the substrate processing system 1 configured as described above, the substrate transfer device 13 of the carry-in/out station 2 first takes out the wafer W from one of the carriers C placed in the carrier placing section 11, and places the taken wafer W on the delivery unit 14. The wafer W placed on the delivery unit 14 is taken out from the delivery unit 14 by the substrate transfer device 17 of the processing station 3, and is carried into one of the processing units 16.

The wafer W carried into the processing unit 16 is processed by the processing unit 16, and then is carried out from the processing unit 16 and placed on the delivery unit 14 by using the substrate transfer device 17. Then, the processed wafer W placed on the delivery unit 14 is returned to the corresponding carrier C in the carrier placing section 11 by using the substrate transfer device 13.

Figure 3:
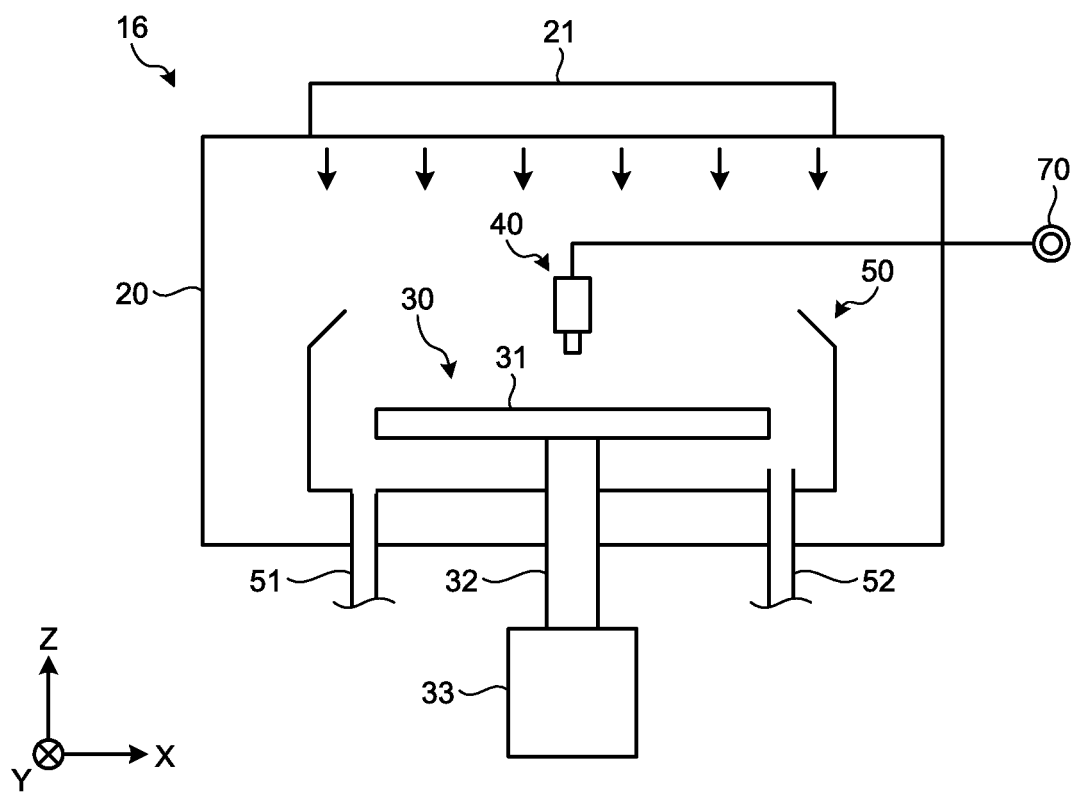
FIG. 3 is a schematic diagram illustrating the configuration of a processing unit.

Next, the schematic configuration of the processing unit 16 will be described with reference to FIG. 3. FIG. 3 is a schematic diagram illustrating the configuration of the processing unit 16.

As illustrated in FIG. 3, the processing unit 16 includes a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on a ceiling of the chamber 20. The FFU 21 forms a downflow within the chamber 20.

The substrate holding mechanism 30 includes a holding unit 31, a supporting unit 32, and a driving unit 33. The holding unit 31 horizontally holds the wafer W. The supporting unit 32 is a vertically extending member, and includes a bottom end rotatably supported by the driving unit 33 and a leading end horizontally supporting the holding unit 31. The driving unit 33 rotates the supporting unit 32 around the vertical axis. The substrate holding mechanism 30 rotates the supporting unit 32 by using the driving unit 33 to rotate the holding unit 31 supported by the supporting unit 32, and consequently rotates the wafer W held on the holding unit 31.

The processing fluid supply unit 40 supplies processing fluid onto the wafer W. The processing fluid supply unit 40 is connected to a processing fluid supply source 70.

The recovery cup 50 is arranged to surround the holding unit 31, and collects processing liquid scattered from the wafer W due to the rotation of the holding unit 31. A drain port 51 is formed on a bottom of the recovery cup 50. The processing liquid collected by the recovery cup 50 is discharged from the drain port 51 to the outside of the processing unit 16. In addition, an exhaust port 52 is formed on the bottom of the recovery cup 50 to discharge gas supplied from the FFU 21 to the outside of the processing unit 16.

Figure 4:
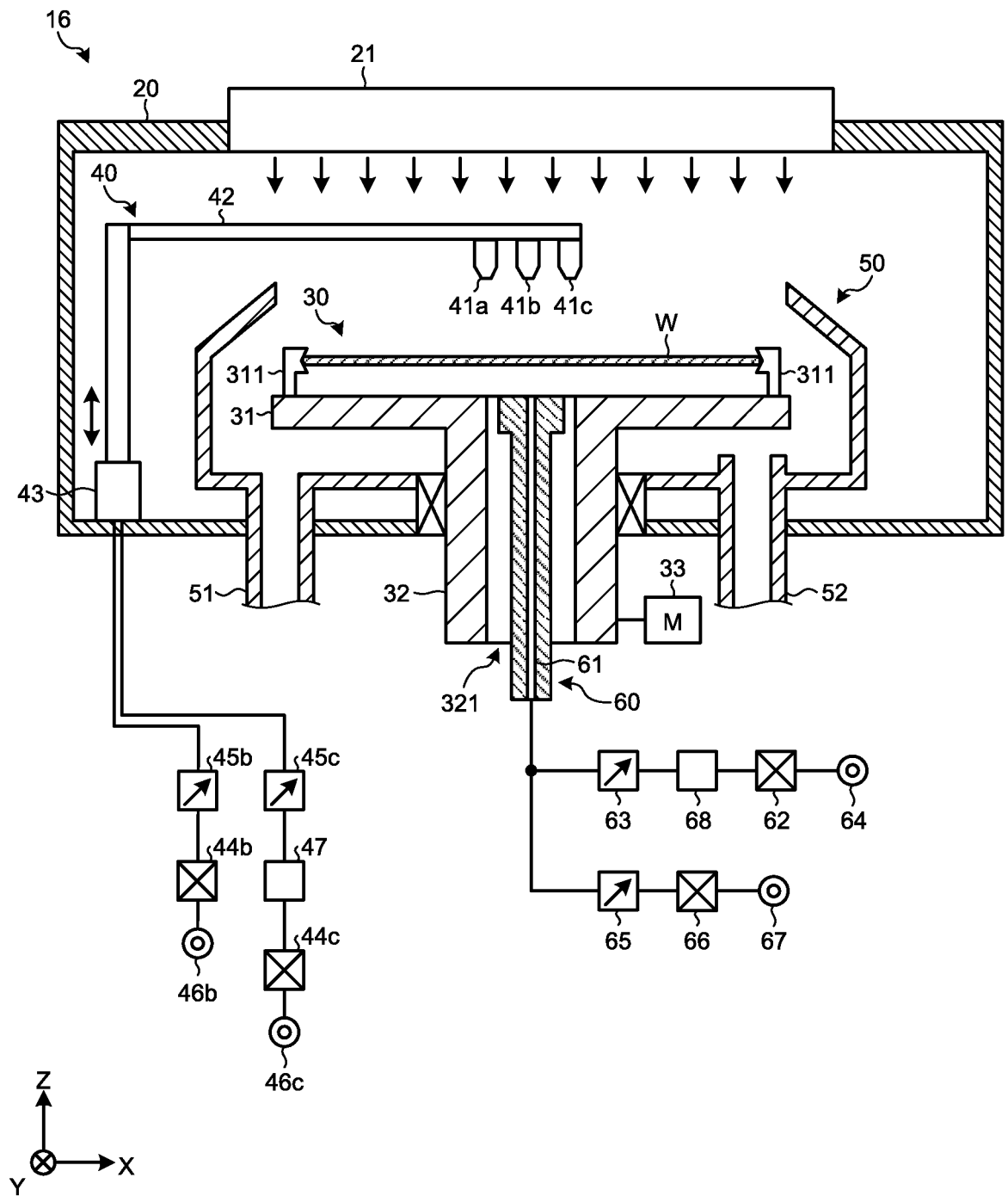
FIG. 4 is a schematic diagram illustrating a specific configuration example of the processing unit.

Next, a specific configuration example of the processing unit 16 will be described with reference to FIG. 4. FIG. 4 is a schematic diagram illustrating a specific configuration example of the processing unit 16.

As illustrated in FIG. 4, a holding member 311 that holds the wafer W from its lateral side is provided on the upper surface of the holding unit 31 included in the substrate holding mechanism 30. The wafer W is horizontally held in a state where the wafer is slightly apart from the upper surface of the holding unit 31 via the holding member 311. In addition, the wafer W is held over the holding unit 31 in a state where a surface on which patterns are formed faces upward.

The processing fluid supply unit 40 includes a plurality (herein, two) of nozzles 41b and 41c, an arm 42 configured to horizontally support the nozzles 41b and 41c, and a turning/lifting mechanism 43 configured to turn and lift/lower the arm 42.

The nozzle 41b is connected to a CDIW supply source 46b via a valve 44b and a flow controller 45b. The CDIW is room-temperature deionized water (e.g., 20 to 25 degrees Celsius) that is not heated. The nozzle 41c is connected to a TMAH supply source 46c via a valve 44c, a heating unit 47, and a flow controller 45c.

The CDIW supplied from the CDIW supply source 46b is discharged from the nozzle 41b. The TMAH (tetramethylammonium hydroxide) supplied from the TMAH supply source 46c is discharged from the nozzle 41c. The TMAH supplied from the TMAH supply source 46c is supplied to the nozzle 41c in a state where the TMAH is heated by the heating unit 47 to a temperature higher than that of the CDIW. In the present embodiment, the TMAH of 35 to 40 degrees Celsius is supplied to the nozzle 41c.

The processing unit 16 further includes a lower surface supply unit 60. The lower surface supply unit 60 is inserted into a hollow part 321 of the holding unit 31 and the supporting unit 32. A flow channel 61 that vertically extends is formed inside the lower surface supply unit 60. A CDIW supply source 64 is connected to the flow channel 61 via a flow controller 63, a heating unit 68, and a valve 62. The CDIW supplied from the CDIW supply source 64 is heated by the heating unit 68 to a temperature higher than that of the CDIW and is supplied to the flow channel 61. Hereinafter, CDIW, which is supplied from the CDIW supply source 64 and is heated by the heating unit 68, is referred to as HDIW. The temperature of HDIW is 35 to 40 degrees Celsius similarly to TMAH discharged from the nozzle 41c.

A CDIW supply source 67 is further connected to the flow channel 61 via a valve 66 and a flow controller 65. In this way, HDIW (deionized water), which is supplied from the CDIW supply source 64 and is heated by the heating unit 68, or CDIW, which is supplied from the CDIW supply source 67, is discharged from the lower surface supply unit 60.

Figure 5:
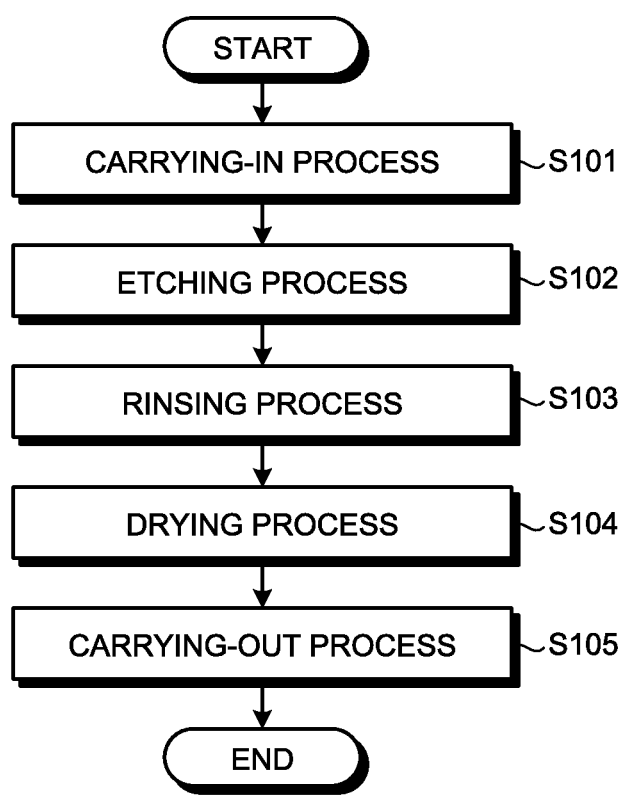
FIG. 5 is a flowchart illustrating the procedure of processing that is executed by the processing unit.
Figure 6:
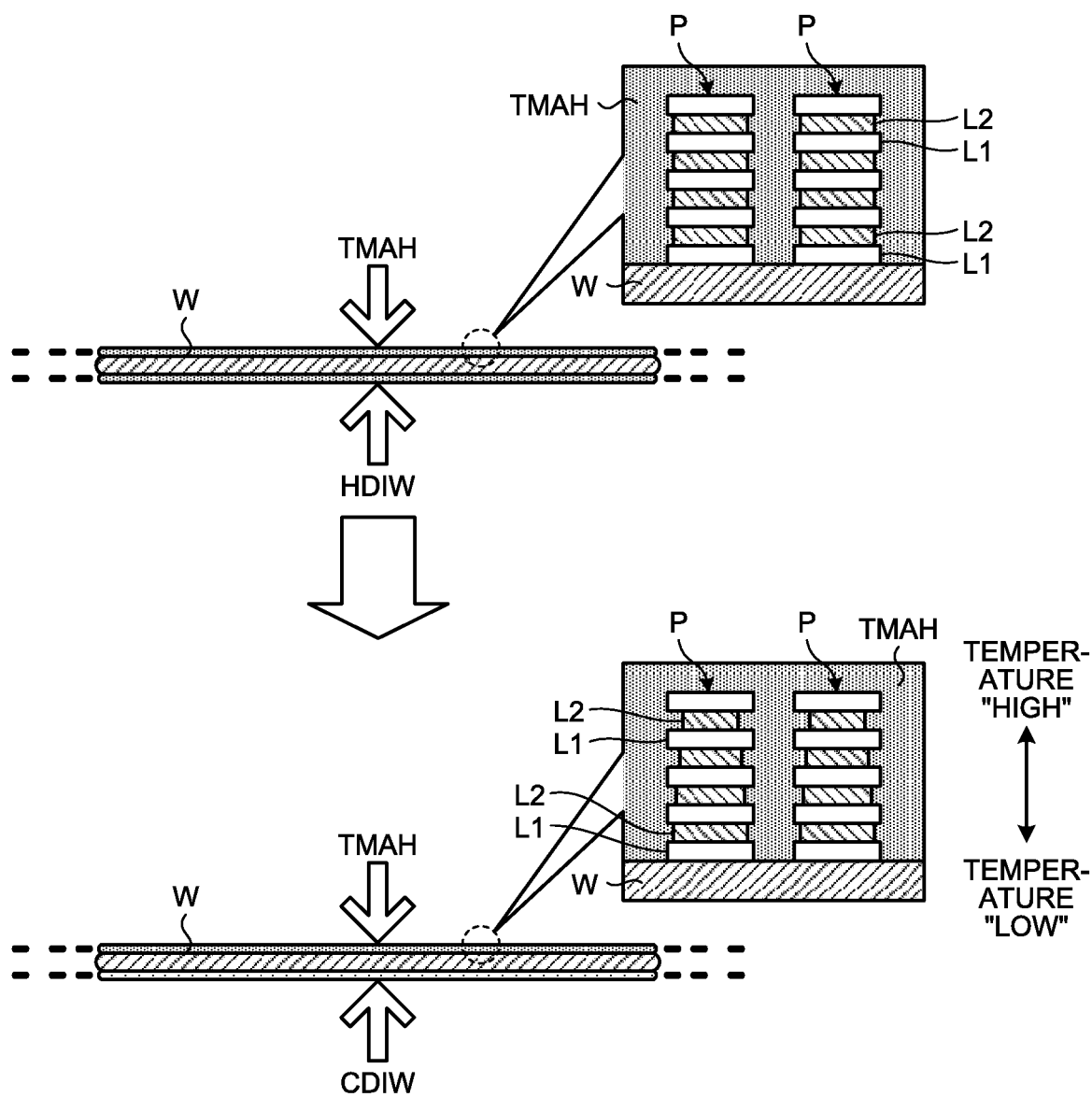
FIG. 6 is a diagram explaining an etching process.
Figure 7:
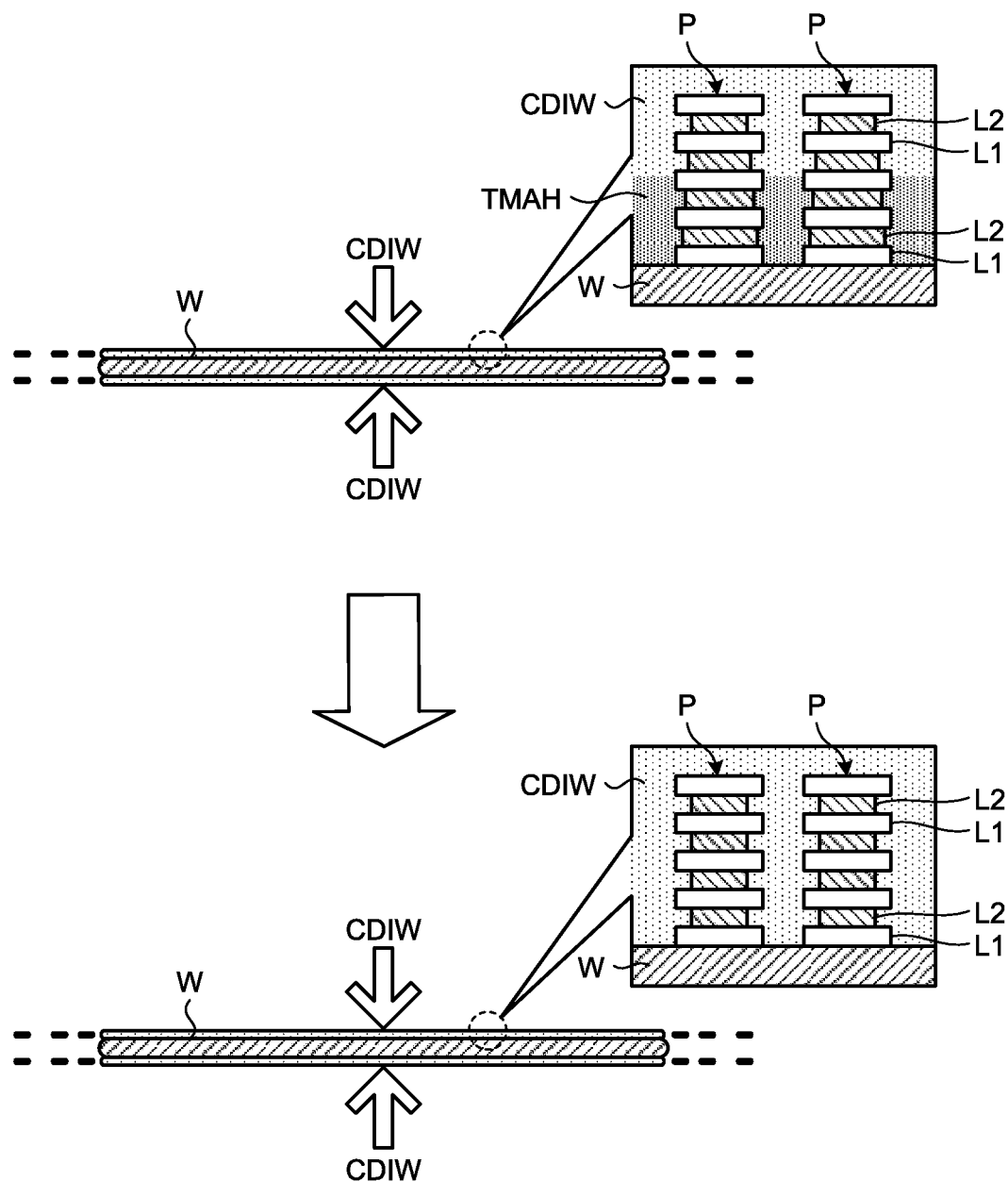
FIG. 7 is a diagram explaining a rinsing process.

Next, processing that is executed by the processing unit 16 will be described with reference to FIGS. 5 to 7. FIG. 5 is a flowchart illustrating the procedure of processing that is executed by the processing unit 16. FIG. 6 is a diagram explaining an etching process. FIG. 7 is a diagram explaining a rinsing process.

As illustrated in FIG. 5, a carrying-in process is first performed in the processing unit 16 (Step S101). In the carrying-in process, the substrate transfer device 17 (see FIG. 2) carries the wafer W into the chamber 20 of the processing unit 16. The wafer W is held by the holding member 311 (see FIG. 4) in a state where its pattern-formed surface faces upward. After that, the controller 18 controls the driving unit 33 to rotate the substrate holding mechanism 30 at a predetermined rotational speed.

Next, an etching process is performed in the processing unit 16 (Step S102). Herein, the etching process according to the present embodiment includes a first etching process and a second etching process. The first etching process supplies HDIW as heated fluid onto the lower surface of the wafer W and concurrently supplies TMAH as etchant onto the upper surface of the wafer W. The second etching process stops supplying HDIW onto the lower surface of the wafer W, supplies CDIW that is lower-temperature fluid than TMAH onto the lower surface of the wafer W and concurrently supplies TMAH onto the upper surface of the wafer W. A temperature-difference forming process according to the present embodiment is equivalent to the second etching process.

First, the first etching process is performed in the processing unit 16. In the first etching process, the nozzle 41c of the processing fluid supply unit 40 is located at the middle position over the wafer W. After that, TMAH that is an etchant is supplied onto the upper surface of the wafer W by opening the valve 44c for a predetermined time. Furthermore, HDIW (example of heated fluid) is supplied onto the lower surface of the wafer W by opening the valve 62 for a predetermined time. Open timings of the valve 44c and the valve 62 are the same or substantially the same time. Herein, the open time of the valve 62 is set shorter than that of the valve 44c.

As illustrated in the upper drawing of FIG. 6, TMAH supplied onto the upper surface of the wafer W spreads all over the upper surface of the wafer W due to a centrifugal force induced by the rotation of the wafer W. Similarly, HDIW supplied onto the lower surface of the wafer W spreads all over the lower surface of the wafer W due to the centrifugal force induced by the rotation of the wafer W. As a result, the second films of the patterns P formed on the upper surface are etched by the TMAH. Furthermore, the entire surface of the wafer W is uniformly heated by the HDIW, and thus the uniformity of amounts of etching of the patterns P in an in-plane direction can be improved.

In the present embodiment, HDIW is used as an example of heated fluid, but the present disclosure is not limited thereto. In other words, heated fluid may be heated liquid (e.g., TMAH) other than HDIW. Alternatively, heated fluid may be heated gas (dried air, N2, etc.).

Next, the second etching process is performed in the processing unit 16. In the second etching process, among the valve 44c and the valve 62, the valve 62 is closed to stop supplying the HDIW to the lower surface of the wafer W and concurrently the valve 66 is opened for a predetermined time to supply CDIW onto the lower surface of the wafer W.

The CDIW supplied onto the lower surface of the wafer W spreads all over the lower surface of the wafer W due to the centrifugal force induced by the rotation of the wafer W (see the lower drawing of FIG. 6).

Because the temperature of CDIW is lower than that of TMAH, the wafer W is cooled from its lower side. As a result, a temperature in the lower portions of the patterns P can be set lower than a temperature in the upper portions of the patterns P. By decreasing a temperature in the lower portions of the patterns P, reactivity of TMAH in the lower portions of the patterns P becomes lower compared with reactivity of TMAH in the upper portions of the patterns P. As a result, in the etching process, an amount of etching of the lower portions of the patterns P can become lower than an amount of etching of the upper portions of the patterns P. Therefore, as illustrated in the lower drawing of FIG. 6, the etching-processed patterns P have the second films L2 whose widths increase gradually from the upper portions toward the lower portions of the patterns P, contrary to the shape illustrated in the lower drawing of FIG. 1A.

Next, a rinsing process is performed in the processing unit 16 (Step S103). In the rinsing process, the nozzle 41b of the processing fluid supply unit 40 is first located at the middle position over the wafer W, and CDIW is supplied onto the upper surface of the wafer W by opening the valve 44b for a predetermined time. The CDIW supplied onto the upper surface of the wafer W spreads all over the upper surface of the wafer W due to the centrifugal force induced by the rotation of the wafer W. As a result, TMAH remaining on the upper surface of the wafer W is replaced with CDIW.

As illustrated in the upper drawing of FIG. 7, even after TMAH of the upper portions of the patterns P is replaced with CDIW, TMAH continues to remain on the lower portions of the patterns P for a while. In other words, the etchant remains on the lower portions of the patterns P at a higher concentration than that of the upper portions of the patterns P. For this reason, in the rinsing process, the lower portions of the patterns P are etched more than the upper portions of the patterns P. In addition, the concentration of TMAH in the lower portions of the patterns P gradually decreases with the passage of time, and the lower-portion TMAH is perfectly replaced with CDIW. Thus, the etching of the lower portions of the patterns P is terminated (see the lower drawing of FIG. 7).

As described above, in the rinsing process, CDIW is supplied onto the etching-processed upper surface to replace TMAH remaining on the upper surface of the wafer W with the CDIW. The lower portions of the patterns P are etched more than the upper portions of the patterns P due to TMAH remaining on the lower portions of the patterns P (see the upper drawing of FIG. 7), and thus an amount of etching of the lower portions of the patterns P approaches an amount of etching of the upper portions of the patterns P (see the lower drawing of FIG. 7). In other words, the shape of the patterns P is changed from a shape of the patterns P, whose widths of the second films L2 increase gradually from the upper portions toward the lower portions of the patterns P as illustrated in the upper drawing of FIG. 7, to a shape of the patterns P whose widths of the second films L2 are vertically uniformed as illustrated in the lower drawing of FIG. 7. As a result, it is possible to uniform amounts of etching of the patterns P in a vertical direction.

In the rinsing process, CDIW continues to be supplied onto the lower surface of the wafer W while CDIW is supplied onto the upper surface of the wafer W, and thus it is possible to enhance the uniformity of amounts of etching of the patterns P in an in-plane direction.

In the present embodiment, CDIW is supplied onto the lower surface of the wafer W in the temperature-difference forming process, but it is sufficient that liquid to be supplied onto the lower surface of the wafer W in the temperature-difference forming process is liquid or gas of lower temperature than that of TMAH that is an etchant. Thus, it is not necessarily required that the liquid is CDIW.

Next, a drying process for drying the wafer W is performed in the processing unit 16 (Step S104).

After that, a carrying-out process is performed in the processing unit 16 (Step S105). In the carrying-out process, the rotation of the wafer W is stopped, and then the wafer W is carried out from the processing unit 16 by using the substrate transfer device 17 (see FIG. 2). When the carrying-out process is completed, substrate processing including a series of processes for the wafer W (one wafer) is completed.

As described above, the processing unit 16 (example of substrate processing apparatus) according to the present embodiment includes the substrate holding mechanism 30 (example of holding unit), the processing fluid supply unit 40 (example of etchant supply unit and rinse liquid supply unit), and the lower surface supply unit 60 (example of temperature-difference forming unit). The substrate holding mechanism 30 holds the wafer W (example of substrate) that has the patterns P formed on its upper surface (example of first surface). The processing fluid supply unit 40 supplies TMAH (example of etchant) onto the upper surface of the wafer W held in the substrate holding mechanism 30 so as to etch the patterns P. The lower surface supply unit 60 supplies CDIW onto the lower surface of the wafer W, in parallel with the supply of TMAH by the processing fluid supply unit 40, and thus a temperature in the lower portions of the patterns P is set lower than a temperature in the upper portions of the patterns P. The processing fluid supply unit 40 supplies CDIW (example of rinse liquid) onto the upper surface of the wafer W after TMAH is supplied so as to replace TMAH remaining on the lower portions of the patterns P with the CDIW.

By performing the temperature-difference forming process for making a temperature in the lower portions of the patterns P lower than a temperature in the upper portions of the patterns P in parallel with the etching process of the patterns P, the etching-processed patterns P have the second films L2 whose widths increase gradually from the upper portions toward the lower portions of the patterns P (see the lower drawing of FIG. 6). After that, in the rinsing process for replacing TMAH remaining on the lower portions of the patterns P with CDIW, the lower portions of the patterns P are etched more than the upper portions of the patterns P due to TMAH remaining on the lower portions of the patterns P, and thus the shape of the patterns P approaches a shape of the patterns P whose widths of the second films L2 are vertically uniformed (see the lower drawing of FIG. 7).

Therefore, according to the processing unit 16 of the present embodiment, it is possible to improve the uniformity of amounts of etching of the patterns P in a vertical direction.

First Alternative Example

Figure 8:
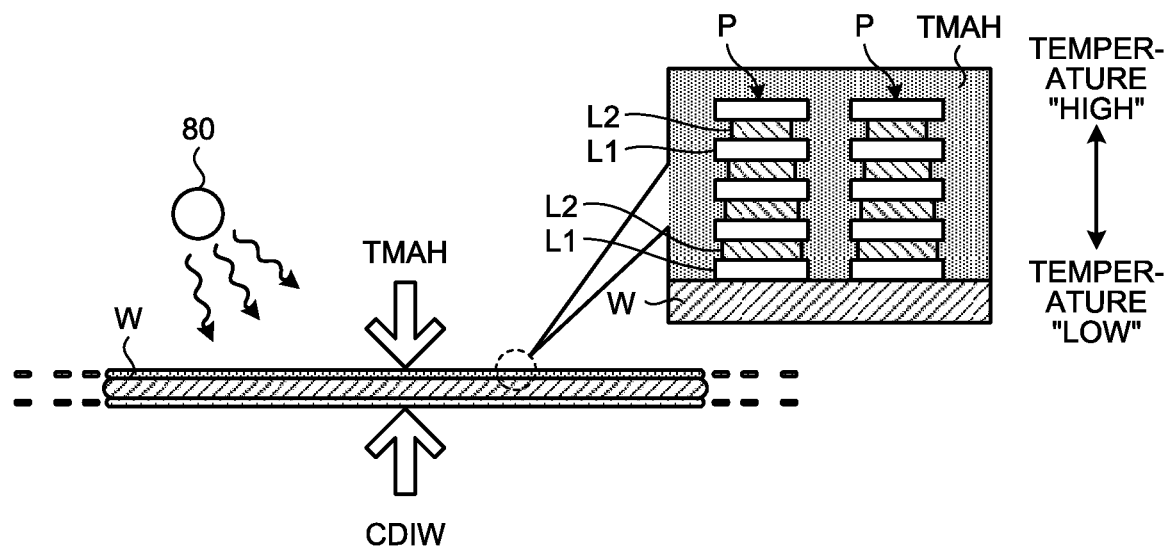
FIG. 8 is a diagram explaining a temperature-difference forming process according to a first alternative example.

In the embodiment described above, a temperature difference is provided to the patterns P by cooling the wafer W from its reverse side, but a temperature difference may be provided to the patterns P by heating the wafer W from its upper side. FIG. 8 is a diagram explaining a temperature-difference forming process according to the first alternative example.

As illustrated in FIG. 8, the processing unit 16 according to the first alternative example further includes a heating unit 80. The heating unit 80 is an electrothermal heater, for example. The heating unit 80 heats the upper surface of the wafer W to a temperature higher than that of TMAH by using heat of radiation. A temperature in the upper portions of the patterns P becomes higher than a temperature in the lower portions of the patterns P by heating the upper surface of the wafer W. As a result, an amount of etching in the lower portions of the patterns P can become lower than an amount of etching in the upper portions of the patterns P.

The heating unit 80 is not limited to a heater that uses heat of radiation. The heating unit 80 may supply hot wind onto the upper surface of the wafer W so as to heat the upper surface of the wafer W.

As illustrated in FIG. 8, the temperature-difference forming process may cool the lower surface of the wafer W by supplying CDIW onto the lower surface of the wafer W and concurrently heat the upper surface of the wafer W by using the heating unit 80.

Second Alternative Example

The etching process has a possibility that CDIW supplied in the rinsing process remains on the lower portions of the patterns P so as to obstruct the etching of the lower portions of the patterns P. Furthermore, because TMAH of the lower portions of the patterns P is hard to replace with TMAH discharged newly even after CDIW is replaced with TMAH, a concentration of hydroxide ions (ions needed for etching) in TMAH in the lower portions becomes lower than that of the upper portions of the patterns P, and thus the upper and lower portions of the patterns P may have different amounts of etching.

Therefore, an etching process according to the second alternative example enhances the replacement efficiency of CDIW or TMAH within the patterns P by changing a discharge flow volume of TMAH so as to improve the uniformity of amounts of etching of the patterns P in a vertical direction.

Figure 9:
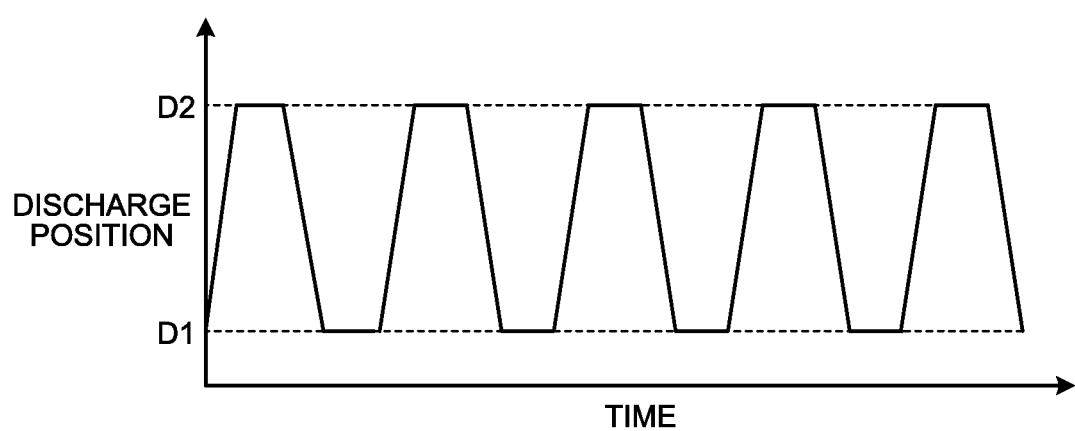
FIG. 9 is a diagram illustrating an example of a time change in a discharge flow volume in an etching process according to a second alternative example.
Figure 10A:
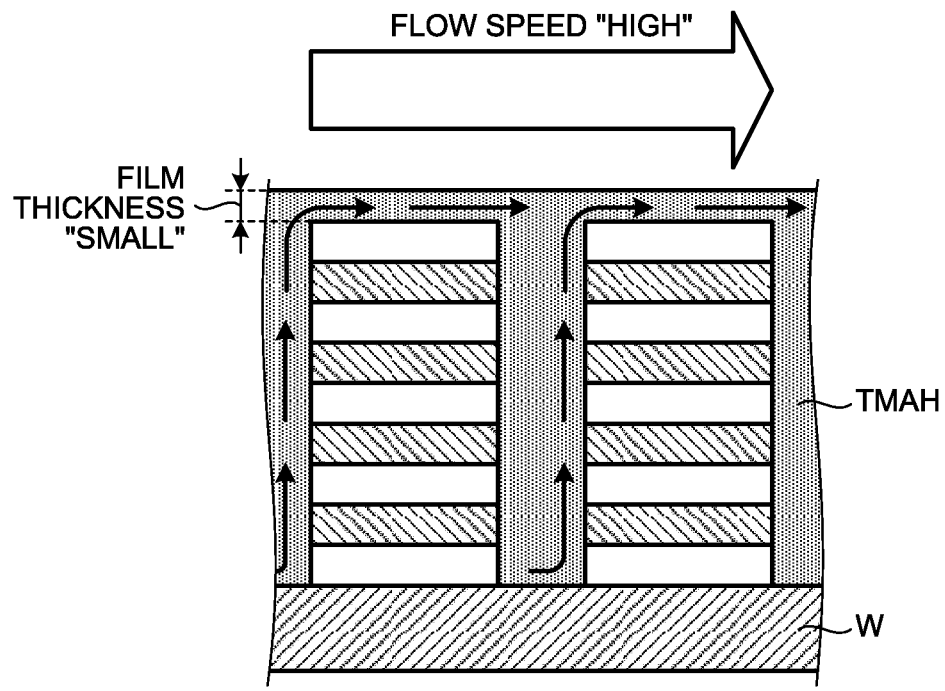
FIG. 10A is a diagram illustrating a flow of TMAH when a discharge flow volume is large.
Figure 10B:
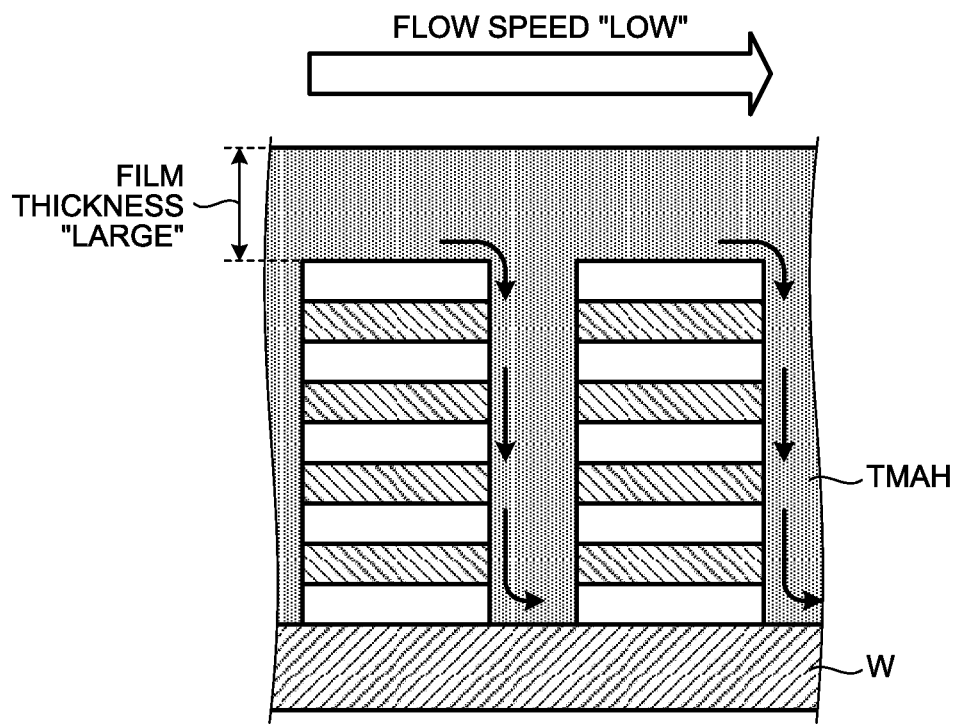
FIG. 10B is a diagram illustrating a flow of TMAH when the discharge flow volume is small.

The etching process according to the second alternative example will be described with reference to FIG. 9 and FIGS. 10A and 10B. FIG. 9 is a diagram illustrating an example of a time change of a discharge flow volume in the etching process according to the second alternative example. FIG. 10A is a diagram illustrating a flow of TMAH when the discharge flow volume is large. FIG. 10B is a diagram illustrating a flow of TMAH when the discharge flow volume is small.

As illustrated in FIG. 9, the etching process (first and second etching processes) according to the second alternative example alternately changes a flow volume of TMAH to be discharged from the nozzle 41c between D1 (L/min) and D2 (L/min) more than D1.

The flow volume D2 is the same as the flow volume of TMAH discharged to the wafer W in the first embodiment. The flow volume D1 is a flow volume smaller than the flow volume D2. By setting flow volumes as described above, the flow volumes cannot exceed an upper limit of a liquid discharge amount in the processing unit 16, and further the generation of splashes of liquid can be prevented.

A flow speed and a liquid-film thickness (film thickness) of TMAH flowing on the upper surface of the wafer W are changed when the discharge flow volume of TMAH is changed. Specifically, as the discharge flow volume of TMAH becomes larger, the flow speed thereof becomes higher and the film thickness thereof becomes smaller. As illustrated in FIG. 10A, because force acting on TMAH of the lower portions of the patterns P in a gravitational direction (vertical direction) becomes weak if the film thickness of TMAH becomes small, TMAH of the lower portions of the patterns P easily moves to the upper portions of the patterns P. Furthermore, because force acting on TMAH of the upper portions of the patterns P in a horizontal direction (transverse direction) becomes strong if the flow speed of TMAH becomes fast, TMAH of the upper portions of the patterns P is easily discharged from the wafer W.

On the other hand, as the discharge flow volume of TMAH becomes smaller, the flow speed thereof becomes lower and the film thickness thereof becomes larger. As illustrated in FIG. 10B, if the flow speed of TMAH becomes slow, force acting on TMAH of the upper portions of the patterns P in a horizontal direction becomes weak. Furthermore, if the film thickness of TMAH becomes large, force acting on TMAH of the lower portions of the patterns P in a gravitational direction becomes strong. As a result, fresh TMAH located in the upper portions of the patterns P easily penetrate into the patterns P.

As described above, it is possible to enhance the replacement efficiency of liquid inside the patterns P by supplying TMAH onto the upper surface of the wafer W while alternately repeating an increasing process for increasing the flow volume of TMAH and a decreasing process for decreasing the flow volume of TMAH that is increased by the increasing process. As a result, it is possible to improve the uniformity of amounts of etching of the patterns P in a vertical direction.

Third Alternative Example

Figure 11:
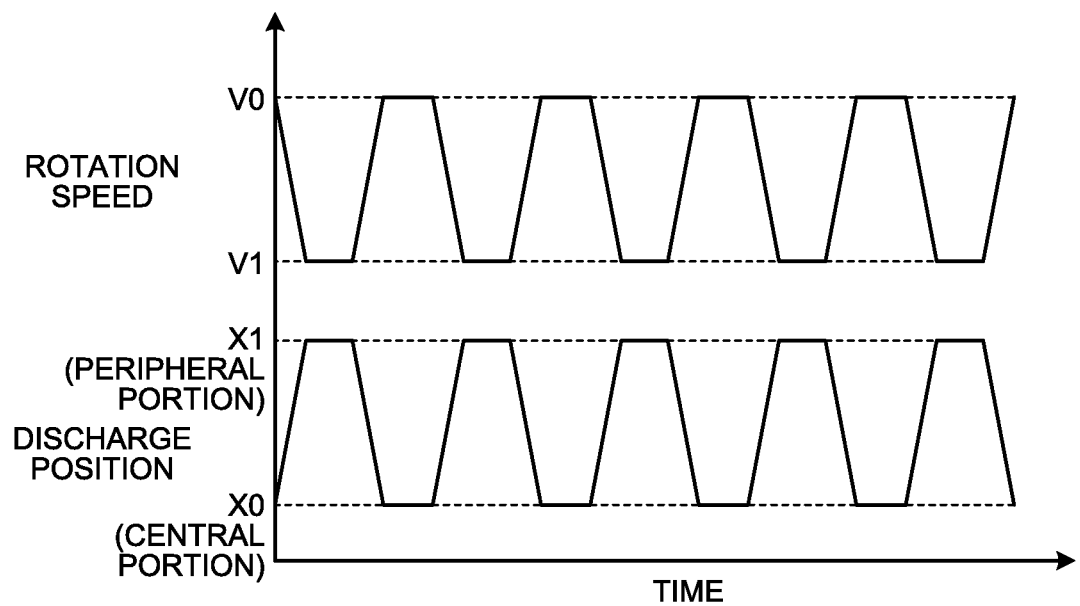
FIG. 11 is a diagram illustrating an example of a time change in the number of rotations of a wafer and the discharge position of TMAH in an etching process according to a third alternative example.

In the second alternative example described above, the replacement efficiency of liquid within the patterns P is enhanced by changing the discharge flow volume of TMAH, but the replacement efficiency of liquid within the patterns P may be enhanced by changing the number of rotations of the wafer W. This point will be described with reference to FIG. 11. FIG. 11 is a diagram illustrating an example of a time change of the number of rotations of the wafer W and the discharge position of TMAH in an etching process according to the third alternative example.

As illustrated in FIG. 11, the etching process (first and second etching processes) according to the third alternative example alternately changes the number of rotations of the wafer W between V0 (rpm) and V1 (rpm) slower than V0.

The flow speed and film thickness of TMAH flowing on the upper surface of the wafer W are changed if the number of rotations of the wafer W is changed.

Specifically, as the number of rotations of the wafer W becomes higher, the flow speed of TMAH becomes faster and the film thickness of TMAH becomes smaller. Because force acting on TMAH of the lower portions of the patterns P in a gravitational direction becomes weak if the film thickness of TMAH becomes small, TMAH of the lower portions of the patterns P easily moves to the upper portion of the patterns P. Furthermore, because force acting on TMAH of the upper portions of the patterns P in a horizontal direction becomes strong if the flow speed of TMAH becomes fast, TMAH of the upper portions of the patterns P is easily discharged from the wafer W.

On the other hand, as the number of rotations of the wafer W becomes lower, the flow speed of TMAH becomes slower and the film thickness of TMAH becomes larger. If the flow speed of TMAH becomes slow, force acting on TMAH of the upper portions of the patterns P in a horizontal direction becomes weak. Furthermore, if the film thickness of TMAH becomes large, force acting on TMAH of the lower portions of the patterns P in a gravitational direction becomes strong. Therefore, fresh TMAH located on the upper portions of the patterns P easily penetrates into the patterns P.

Furthermore, when the number of rotations of the wafer W is changed, centrifugal acceleration is changed. When the centrifugal acceleration is changed, horizontal-direction force acting on the wafer W is changed. As this force becomes larger, liquid within the patterns P is more easily discharged from the patterns P. As this force becomes smaller, fresh TMAH more easily penetrates into the patterns P.

As described above, it is possible to enhance the replacement efficiency of liquid within the patterns P by supplying TMAH onto the upper surface of the wafer W while alternately repeating a speed increasing process for increasing the rotational speed of the wafer W and a speed decreasing process for decreasing the rotational speed of the wafer W. As a result, it is possible to improve the uniformity of amounts of etching of the patterns P in a vertical direction.

As illustrated in FIG. 11, in addition to the above process, the etching process according to the third alternative example performs a process for alternately changing the discharge position of TMAH between X0 (e.g., the central portion of the wafer W) and X1 (e.g., the peripheral portion of the wafer W) located on the more outer circumferential side of the wafer W than X0. As described above, the uniformity of amounts of etching of the patterns P in an in-plane direction can be improved by changing the discharge position.

When the number of rotations of the wafer W is changed in a decreasing direction, the discharge position of TMAH is controlled by the controller 18 to move toward the peripheral side of the wafer W. When the number of rotations of the wafer W is changed in an increasing direction, the discharge position of TMAH is controlled by the controller 18 to move toward the central side of the wafer W. As described above, according to the etching process of the third alternative example, the speed decreasing process is performed in parallel with a first moving process for moving the discharge position of TMAH from the central portion to the peripheral portion of the wafer W, and the speed increasing process is performed in parallel with a second moving process for moving the discharge position of TMAH from the peripheral portion to the central portion of the wafer W. As a result, it is possible to prevent splashes of liquid that come about when TMAH is discharged and concurrently the discharge position is changed and also to improve the uniformity of amounts of etching of the patterns P in an in-plane direction.

In the present alternative example, the discharge position of TMAH is changed, but the discharge position of TMAH may be fixed.

Fourth Alternative Example

Figure 12:
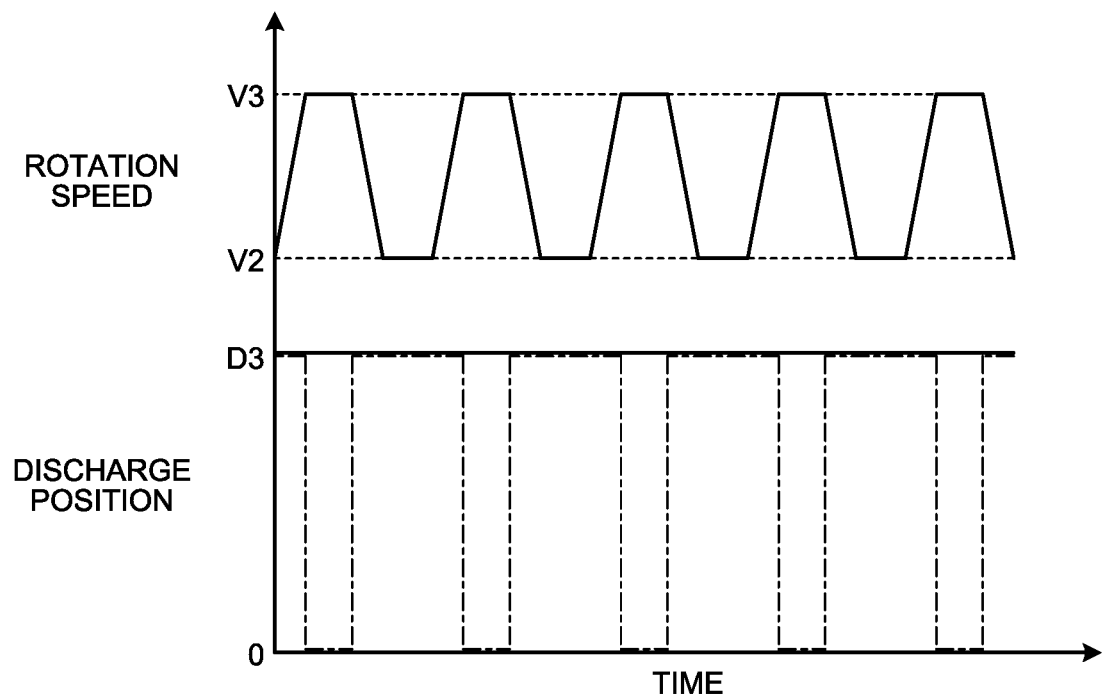
FIG. 12 is a diagram illustrating an example of a time change in the number of rotations of the wafer and the discharge flow volume of CDIW in a rinsing process according to a fourth alternative example.

The process for changing the number of rotations of the wafer W may be performed during a rinsing process. This point will be described with reference to FIG. 12. FIG. 12 is a diagram illustrating an example of a time change of the number of rotations of the wafer W and the discharge flow volume of CDIW in a rinsing process according to the fourth alternative example.

As illustrated in FIG. 12, the rinsing process according to the fourth alternative example alternately changes the number of rotations of the wafer W between V2 (rpm) and V3 (rpm) faster than V2. As a result, more CDIW and foreign materials included in the CDIW can be discharged from the wafer W at high-speed rotation. Furthermore, CDIW is hard to discharge from the wafer W at low-speed rotation, and thus the liquid film of CDIW becomes thicker than the liquid film of CDIW at high-speed rotation. Therefore, a concentration of foreign materials in the liquid film can be decreased, and thus the decrease in the concentration of foreign materials can prevent the foreign materials from being reattached to the wafer W.

As described above, according to the rinsing process of the fourth alternative example, CDIW is supplied onto the upper surface of the wafer W while alternately repeating the speed increasing process for increasing the rotational speed of the wafer W and the speed decreasing process for decreasing the rotational speed of the wafer W. As a result, foreign materials can be efficiently discharged along with the flow of CDIW while suppressing the reattachment of the foreign materials to the wafer W.

Meanwhile, the inside of the liquid film of CDIW includes an area in which CDIW flows comparatively smoothly and an area in which CDIW does not flow smoothly. Specifically, the area in which CDIW flow comparatively smoothly is an upside area of the liquid film, and foreign materials located in this area are mainly discharged from the wafer W. On the other hand, the area in which CDIW does not flow smoothly is a downside area of the liquid film, namely, a boundary layer between the liquid film and the upper surface of the wafer W, and foreign materials located in this area are hard to discharge from the wafer W. As described above, because the discharge of foreign materials is performed in the area in which CDIW flows smoothly, it is preferable that the number of rotations of the wafer W at high-speed rotation is set within a range in which at least the fluidity of CDIW in the liquid film can be maintained, namely, a range in which the film thickness by which the flow area of CDIW can exist can be maintained.

In the rinsing process according to the fourth alternative example, the discharge of CDIW may be stopped during high-speed rotation (V3) as illustrated with chain lines of FIG. 12. The film thickness of CDIW becomes thin by stopping the discharge of CDIW. Furthermore, the thinner the film thickness of CDIW becomes, the smaller an area in which CDIW does not flow smoothly becomes. Therefore, foreign materials can be discharged in a shorter time and with a small amount of CDIW by stopping the discharge of CDIW during high-speed rotation. However, as described above, it is preferable that the film thickness of CDIW is maintained at a thickness by which the flow area of CDIW can exist in the liquid film.

Other Alternative Example

In the embodiment and alternative examples described above, the upper surface of the wafer W is regarded as the first surface and the lower surface thereof is regarded as the second surface, but the lower surface of the wafer W may be the first surface that is a pattern-formed surface and the upper surface thereof may be the second surface.

In the embodiment and alternative examples described above, TMAH is used as an example of an etchant, but the etchant is not limited to TMAH. For example, HF (hydrofluoric acid) etc. can be used as an etchant other than TMAH. Furthermore, in the embodiment and alternative examples described above, CDIW is used as an example of rinse liquid, but rinse liquid is not limited to CDIW. For example, IPA (isopropyl alcohol) etc. can be used as rinse liquid other than CDIW.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A substrate processing method comprising:
    (a) supplying an etchant onto a first surface of a substrate to etch a circuit pattern convexly formed on the first surface;
    (b) setting, in parallel with the step (a), a first temperature in a lower portion of the circuit pattern in the etchant lower than a second temperature in an upper portion of the circuit pattern in the etchant based on a reactivity of the etchant at the first temperature and the second temperature; and
    (c) supplying rinse liquid onto the etched first surface after the step (a) to replace the etchant remaining on the circuit pattern with the rinse liquid so that an amount of etching of the lower portion of the circuit pattern equals an amount of etching of the upper portion of the circuit pattern.

2. The substrate processing method according to claim 1, wherein the step (c) includes: (c-1) supplying the rinse liquid onto the etched first surface after the step (a); and (c-2) concurrently with the (c-1), etching the lower portion of the circuit pattern more than the upper portion of the circuit pattern by the etchant remaining on the lower portion of the circuit pattern at a higher concentration than the etchant remaining on the upper portion of the circuit pattern.

3. The substrate processing method according to claim 1, wherein the step (b) includes supplying lower-temperature fluid than the etchant onto a second surface opposite to the first surface of the substrate to make the temperature in the lower portion of the circuit pattern lower than the second temperature in the upper portion of the circuit pattern.

4. The substrate processing method according to claim 3, wherein the lower-temperature fluid than the etchant is deionized water.

5. The substrate processing method according to claim 3, wherein the step (a) includes:
    (d) supplying heated fluid onto the second surface and concurrently supplying the etchant onto the first surface; and
    (e) supplying the etchant onto the first surface in a state where the supplying the heated fluid onto the second surface is stopped, the step (b) is performed in parallel with the step (e).

6. The substrate processing method according to claim 1, wherein the step (b) includes heating the first surface of the substrate by heat of radiation or hot wind to make the second temperature in the upper portion of the circuit pattern higher than the first temperature in the lower portion of the circuit pattern.

7. The substrate processing method according to claim 1, wherein the step (a) includes supplying the etchant onto the first surface while alternately repeating an increasing process for increasing a flow volume of the etchant and a decreasing process for decreasing the flow volume of the etchant that is increased by the increasing process.

8. The substrate processing method according to claim 1, wherein the step (a) includes supplying the etchant onto the first surface while alternately repeating a speed increasing process for increasing a rotational speed of the substrate and a speed decreasing process for decreasing the rotational speed of the substrate.

9. The substrate processing method according to claim 8, wherein the step (a) includes:
    (f) moving a discharge position of the etchant from a central portion to a peripheral portion of the substrate; and
    (g) moving the discharge position of the etchant from the peripheral portion to the central portion of the substrate, the speed decreasing process is performed in parallel with the step (f), and the speed increasing process is performed in parallel with the step (g).

10. The substrate processing method according to claim 1, wherein the step (c) includes supplying the rinse liquid onto the first surface while alternately repeating a speed increasing process for increasing a rotational speed of the substrate and a speed decreasing process for decreasing the rotational speed of the substrate.

* * * * *